United States Patent [19]

Adam

[11] 3,939,437

[45] Feb. 17, 1976

[54] ALL-PASS REVERBERATOR WITH AN MOS DELAY LINE

[75] Inventor: Fritz Guenter Adam, Freiburg, Germany

[73] Assignee: ITT Industries, Inc., New York, N.Y.

[22] Filed: Nov. 22, 1974

[21] Appl. No.: 526,343

[30] Foreign Application Priority Data

Dec. 7, 1973 Germany ............................ 2360984

[52] U.S. Cl. ............... 330/84; 84/DIG. 26; 330/85; 330/151

[51] Int. Cl.$^2$ ............................................ H03F 3/68

[58] Field of Search ......... 330/21, 85, 107, 84, 109, 330/151; 84/1.24, DIG. 10, DIG. 26; 171/1 J; 333/29

[56] References Cited

UNITED STATES PATENTS 3,110,771 11/1963 Logan, Jr. et al............... 84/1.24 X 3,761,629 9/1973 Suzuki ............................ 84/1.24 X

OTHER PUBLICATIONS

Schroeder, "Natural Sounding Artificial Reverberation," Journal of The Audio Engineering Society, July 1962, Vol. 10, No. 3, pp. 219–223.

*Primary Examiner*—James B. Mullins
*Attorney, Agent, or Firm*—John T. O'Halloran; Menotti J. Lombardi, Jr.; Peter Van Der Sluys

[57] ABSTRACT

The invention provides a circuit for an all-pass reverberator with an MOS delay line and feed back amplifier. The circuit compensates for the frequency-dependent attenuation of the delay line. Two amplifiers of the prior art circuit are replaced by resistors and a third one has specific characteristics.

4 Claims, 4 Drawing Figures

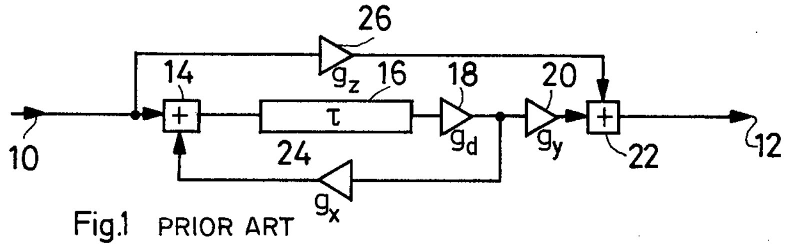
Fig.1 PRIOR ART
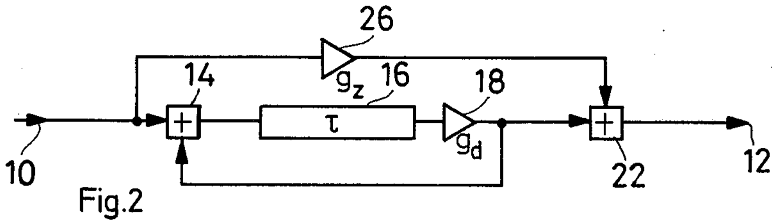
Fig.2
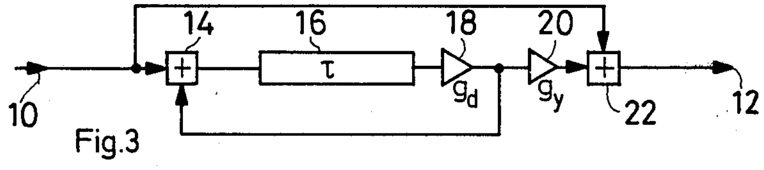
Fig.3
Fig.4
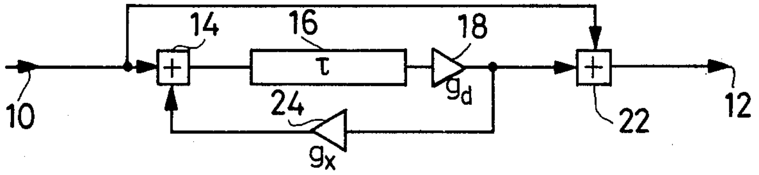

ALL-PASS REVERBERATOR WITH AN MOS DELAY LINE

BACKGROUND OF THE INVENTION

1. Field of the Invention

The present invention relates to an all-pass reverberator and more particularly to a reverberator having an MOS delay line.

2. Description of the Prior Art

The present invention starts from an article by M. R. Schroeder entitled "Natural Sounding Artificial Reverberation" and published in "Journal of the Audio Engineering Society," 10/3, (July 1962), pp. 219 to 223. That article deals with a basic circuit for an all-pass reverberator with a delay line fed back via a feedback amplifier and a first adding circuit at the input of the basic circuit and connected in series with an output amplifier between the output of the first adding circuit and a first input of a second adding circuit connected to the output of the basic circuit the second input of which second adding circuit is connected to the output of a signal amplifier whose input is connected to the input of the first adding circuit.

In the aforementioned article a delay line is required which has neither any gain nor attenuation nor frequency response, i.e. with $g_d = 1$, whereby the attenuation of the delay line will be designated in the following. Another teaching of that article is that three amplifiers or attenuators with definite gains or attenuation factors are necessary to achieve all-pass characteristics. By contrast, the present invention relates to a basic circuit for an all-pass reverberator which uses as the delay line an MOS delay line as known from, e.g., the journal "Elektor" (January 1973), pp. 112 to 117. Such use presents special problems regarding the design and alignment of the amplifiers, whose gain must be frequency-dependent.

In practice, an MOS delay line has a frequency-dependent attenuation given by $$g_d = g_o \cdot \exp\left(-n_d\,\delta_m \cdot \sin^2 \frac{\pi f}{f_c}\right) \qquad (1)$$

where $f$ = signal frequency $f_c$ = clock frequency $n_d$ = number of stages (determining the time delay $\tau$)

$\delta_m$ = maximum stage attenuation at $f = f_c/2$.

For a large $n_d\delta_m$, therefore, appreciable deviations from the all-pass behavior are to be expected. To fulfill Schroeder's requirement $g_d = 1$, two measures must be taken:

1. Use must be made of a delay line employing signal regeneration, whereby the exponential factor in (1) is made to be equal to 1 to a good approximation. For this purpose, well-proven signal regeneration circuits are available.
2. $g_o$ must be made to be equal to 1.

SUMMARY OF THE INVENTION

The present invention relates to a basic circuit for an all-pass reverberator with an MOS delay line which is fed back via a feed back amplifier and the first input of an adding circuit at the output of the feedback amplifier and is connected in series with an output amplifier between the output of the first adding circuit and a first input of a second adding circuit which is connected to the output of the basic circuit and whose second input is connected to the output of a signal amplifier whose input is connected to the second input of the first adding circuit, the latter input forming the input of the basic circuit.

According to the invention, the aforementioned problem of designing and aligning the necessary amplifiers is considerably simplified by replacing two of the three amplifiers by a direct connection and designing the third amplifier according to the equation $$g_z = \frac{-g_d^2 g_x g_y}{1 - g_x^2 g_d^2},$$

where $g_d$ is the attenuation of the MOS delay line, $g_x$ is the gain of the feed back amplifier, $g_y$ is the gain of the output amplifier, and $g_z$ is the gain of the signal amplifier.

The foregoing and other objectives and advantages of the present invention will become more apparent from the following description and the accompanying drawings wherein one embodiment of the present invention is described.

BRIEF DESCRIPTION OF THE DRAWINGS

FIG. 1 is a block diagram showing a prior art circuit.

FIGS. 2 to 4 are block diagrams of three embodiments of a circuit according to the present invention.

DESCRIPTION OF THE PREFERRED EMBODIMENTS

Referring to FIG. 1, there is shown a block diagram of a prior art reverberation circuit as taught in the previously mentioned article of M. R. Schroeder. The circuit has an input terminal 10 and an output terminal 12. The input terminal 10 is connected to a first input of an adding circuit 14 which has an output connected to an input of MOS delay line 16. The MOS delay line has an attenuation $g_d$ which is schematically represented by a separate amplifier 18 connected in series with the output of the delay line 16. The output of amplifier 18 is connected to the input of another amplifier 20 having a gain of $g_y$. The output of amplifier 20 is connected to a second adding circuit 22 having an output connected to output terminal 12. The output of amplifier 18 is further connected through a feedback amplifier 24 to a second input of adding circuit 14. Amplifier 24 has a gain $g_x$. Input terminal 10 is connected through a signal amplifier 26 to a second input of adding circuit 22. Amplifier 26 has a gain of $g_z$.

Instead of making $g_o$ to be equal to 1 as in the prior art, the invention proceeds from the problem of how large the gains $g_x$, $g_y$ and $g_z$ must be if $$g_d = g_o \neq 1,$$

i.e., if the line loss has any given constant value.

This general case can be dealt with analogously to the special case in the Schroeder article. For a Dirac's delta function $h_e(t) = \delta(t)$ at the input with the amplitude function $H_e(\omega) = 1$ one obtains the amplitude function at the output of the basic unit of FIG. 1:

$$H_a(\omega) = g_z + \frac{g_d g_y e^{-i\omega\tau}}{1 - g_d g_x e^{-i\omega\tau}}. \qquad (2)$$

From the all-pass condition that the amplitude of $H_a$ should be independent of the frequency $\omega$, i.e., $|H_a(\omega)| = \text{constant}$, one obtains $$g_z = \frac{-g_d^2 g_x g_y}{1-g_x^2 g_d^2}. \quad (3)$$

The basic circuit according to the invention relates to three cases of gain combinations which are shown in the following table besides the general case of FIG. 1.

| FIG. No. | Gain Combination | Relationships between gains |
|---|---|---|
| 1 | $g_d\ g_x\ g_y\ g_z$ | $g_z = \frac{g_d^2\, g_x\, g_y}{1 - g_x^2\, g_d^2}$ |
| 2 | $g_d\ 1\ 1\ g_z$ | $g_z = \frac{1}{1 - 1/g_d^2}$ |
| 3 | $g_d\ 1\ g_y\ 1$ | $g_y = 1 - 1/g_d^2$ |
| 4 | $g_d\ g_x\ 1\ 1$ | $g_x = \frac{1}{2} - \sqrt{\frac{1}{4} + \frac{1}{g_d^2}}$ |

In the table, relationships between $g_d$ (attenuation factor), $g_x$, $g_y$ and $g_z$ (gains) are given.

FIGS. 2 to 4 show three embodiments of the basic circuit according to the invention with only one amplifier each, which must be adapted to the frequency-dependent attenuation of the MOS delay line.

FIG. 2 shows an embodiment of the invention wherein amplifiers 20 and 24 have been omitted so that $g_x$ and $g_y$ have values equal to one in the basic gain formula and the gain $g_z$ of amplifier 26 is equal to $$\frac{1}{1-1/g_d^2}$$

as shown in the previous table for FIG. 2.

FIG. 3 shows an embodiment of the invention wherein amplifiers 24 and 26 have been omitted and the gain $g_y$ of amplifier 20 is $1-1/g_d^2$ as shown in the previous table.

FIG. 4 shows another embodiment of the present invention wherein amplifiers 20 and 26 have been omitted and amplifier 24 has a gain $g_x$ equal to $$\frac{1}{2} - \sqrt{\frac{1}{4} + \frac{1}{g_d^2}}$$

as shown in the previous table.

What is claimed is:

1. An all-pass reverberator, comprising:

an input terminal;

a first adding circuit having first and second inputs and an output, said first input connected to the input terminal;

an MOS delay line having an input and an output and an attenuation of $g_d$, said input being connected to the output of the first adding circuit;

a second adding circuit having first and second inputs and an output;

an output terminal connected to the output of the second adding circuit;

first circuit means for connecting the output of the delay line to the first input of the second adding circuit, said first circuit means having a gain of $g_y$;

second circuit means for connecting the output of the delay line to the second input of the first adding means, said second circuit means having a gain of $g_x$; and third circuit means for connecting the input terminal to the second input of the second adding circuit, said third circuit means having a gain of $g_z$, wherein the gain $$g_z = \frac{-g_d^2 g_x g_y}{1-g_x^2 g_d^2}.$$

2. An all-pass reverberator as described in claim 1, wherein the first circuit means and second circuit means have gains substantially equal to 1 and the third circuit means has a gain $$g_z = \frac{1}{1-1/g_d^2}.$$

3. An all-pass reverberator as described in claim 1, wherein the second circuit means and third circuit means have gains substantially equal to 1 and the first circuit means has a gain $g_y = 1-1/g_d^2$.

4. An all-pass reverberator as described in claim 1, wherein the first circuit means and third circuit means have gains substantially equal to 1 and the second circuit means has a gain $$g_x = \frac{1}{2} - \sqrt{\frac{1}{4} + \frac{1}{g_d^2}}.$$

* * * * *